US010290644B2

(12) United States Patent
Ma et al.

(10) Patent No.: US 10,290,644 B2
(45) Date of Patent: May 14, 2019

(54) NON-VOLATILE MEMORY STRUCTURE AND METHOD FOR PREVENTING NON-VOLATILE MEMORY STRUCTURE FROM GENERATING PROGRAM DISTURBANCE

(71) Applicant: Powerchip Technology Corporation, Hsinchu (TW)

(72) Inventors: Chen-Liang Ma, Taoyuan (TW); Zih-Song Wang, Nantou County (TW)

(73) Assignee: Powerchip Technology Corporation, Hsinchu (TW)

( * ) Notice: Subject to any disclaimer, the term of this patent is extended or adjusted under 35 U.S.C. 154(b) by 0 days.

(21) Appl. No.: 15/622,082

(22) Filed: Jun. 14, 2017

(65) Prior Publication Data

US 2018/0286877 A1    Oct. 4, 2018

(30) Foreign Application Priority Data

Mar. 31, 2017    (TW) .............................. 106111029 A

(51) Int. Cl.
| | | |
|---|---|---|
| *H01L 27/11529* | (2017.01) | |
| *H01L 27/1157* | (2017.01) | |
| *G11C 16/04* | (2006.01) | |
| *H01L 27/11524* | (2017.01) | |
| *G11C 16/34* | (2006.01) | |

(52) U.S. Cl.
CPC .... *H01L 27/11529* (2013.01); *G11C 16/0408* (2013.01); *G11C 16/0466* (2013.01); *G11C 16/0483* (2013.01); *G11C 16/3418* (2013.01); *H01L 27/1157* (2013.01); *H01L 27/11524* (2013.01)

(58) Field of Classification Search
None
See application file for complete search history.

(56) References Cited

U.S. PATENT DOCUMENTS 5,751,631 A  *  5/1998  Liu .................... G11C 16/0483
                                                   257/316
6,043,123 A     3/2000  Wang et al.
(Continued)

FOREIGN PATENT DOCUMENTS

TW          I302741          11/2008

OTHER PUBLICATIONS

Riichiro Shirota et al.,"A New Disturb Free Programming Scheme in Scaled NAND Flash Memory", International Electron Devices Meeting (IEDM), Dec. 5-7, 2011, pp. 9.3.1-9.3.4.
(Continued)

*Primary Examiner* — James G Norman
(74) *Attorney, Agent, or Firm* — JCIPRNET

(57) ABSTRACT

A non-volatile memory structure including a substrate, at least one memory cell, a first doped region, a second doped region, and a third doped region is provided. The memory cell is disposed on the substrate and has a channel region located in the substrate. The first doped region, the second doped region, and the third doped region are sequentially disposed in the substrate in an arrangement direction toward the channel region, and the first doped region is farthest from the channel region. The first doped region and the third doped region are of a first conductive type, and the second doped region is of a second conductive type.

19 Claims, 3 Drawing Sheets

(56) References Cited

U.S. PATENT DOCUMENTS

| | | | |
|---|---|---|---|
| 6,233,177 B1* | 5/2001 | Shokouhi | G11C 16/12 |
| | | | 326/80 |
| 8,355,278 B2 | 1/2013 | Sarin | |
| 8,599,614 B2 | 12/2013 | Miida et al. | |
| 2014/0286101 A1* | 9/2014 | Ito | G11C 16/3459 |
| | | | 365/185.17 |

OTHER PUBLICATIONS

"Office Action of Taiwan Counterpart Application", dated Apr. 30, 2018, p. 1-p. 5.

* cited by examiner

NON-VOLATILE MEMORY STRUCTURE AND METHOD FOR PREVENTING NON-VOLATILE MEMORY STRUCTURE FROM GENERATING PROGRAM DISTURBANCE

CROSS-REFERENCE TO RELATED APPLICATION

This application claims the priority benefit of Taiwan application serial no. 106111029, filed on Mar. 31, 2017. The entirety of the above-mentioned patent application is hereby incorporated by reference herein and made a part of this specification.

BACKGROUND OF THE INVENTION

Field of the Invention

The invention relates to a memory structure and an operation method thereof, and more particularly, to a non-volatile memory structure and a method for preventing the non-volatile memory structure from generating program disturbance.

Description of Related Art

Since a non-volatile memory has the advantage of retaining data after being powered off, many electronic products require the non-volatile memory to maintain normal operation when the electronic products are turned on. However, during the program operation of a selected memory cell in the non-volatile memory, program disturbance often occurs to an unselected memory cell adjacent to the selected memory cell.

SUMMARY OF THE INVENTION

The invention provides a non-volatile memory structure and a method for preventing the non-volatile memory structure from generating program disturbance to effectively prevent the generation of program disturbance.

The invention provides a non-volatile memory structure including a substrate, at least one memory cell, a first doped region, a second doped region, and a third doped region. The memory cell is disposed on the substrate and has a channel region located in the substrate. The first doped region, the second doped region, and the third doped region are sequentially disposed in the substrate in an arrangement direction toward the channel region, and the first doped region is farthest from the channel region. The first doped region and the third doped region are of a first conductive type, and the second doped region is of a second conductive type.

According to an embodiment of the invention, in the non-volatile memory structure, the memory cell includes a first dielectric layer, a charge storage layer, a second dielectric layer, and a conductive layer. The first dielectric layer is disposed on the substrate. The charge storage layer is disposed on the first dielectric layer. The second dielectric layer is disposed on the charge storage layer. The conductive layer is disposed on the second dielectric layer.

According to an embodiment of the invention, in the non-volatile memory structure, the material of the charge storage layer is, for instance, doped polysilicon or silicon nitride.

According to an embodiment of the invention, in the non-volatile memory structure, the memory cell can further include two fourth doped regions. The fourth doped regions are disposed in the substrate at two sides of the conductive layer, and the channel region is located between two adjacent fourth doped regions.

According to an embodiment of the invention, in the non-volatile memory structure, the quantity of the memory cell is plural, for instance, and the memory cells can be connected in series to form a memory cell string.

According to an embodiment of the invention, in the non-volatile memory structure, two adjacent memory cells can share one of the fourth doped regions.

According to an embodiment of the invention, in the non-volatile memory structure, a fifth doped region and a sixth doped region can be further included. The fifth doped region and the sixth doped region are respectively disposed in the substrate at two sides of the memory cell string.

According to an embodiment of the invention, in the non-volatile memory structure, a source line contact and a bit line contact can be further included. The source line contact is electrically connected to the fifth doped region. The bit line contact is electrically connected to the sixth doped region.

According to an embodiment of the invention, in the non-volatile memory structure, a first select gate structure and a second select gate structure can be further included. The first select gate structure is disposed between the fifth doped region and an end of the memory cell string. The second select gate structure is disposed between the sixth doped region and the other end of the memory cell string.

According to an embodiment of the invention, in the non-volatile memory structure, a first dummy memory cell and a second dummy memory cell can be further included. The first dummy memory cell is disposed between the first select gate structure and the end of the memory cell string. The second dummy memory cell is disposed between the second select gate structure and the other end of the memory cell string.

According to an embodiment of the invention, in the non-volatile memory structure, the arrangement direction is, for instance, a direction toward a surface of the substrate.

According to an embodiment of the invention, in the non-volatile memory structure, two ends of the second doped region can be further extended to the surface of the substrate to surround a memory cell region.

According to an embodiment of the invention, in the non-volatile memory structure, the arrangement direction is, for instance, parallel to a channel length direction.

According to an embodiment of the invention, in the non-volatile memory structure, the first doped region is, for instance, located below the source line contact.

According to an embodiment of the invention, in the non-volatile memory structure, an isolation doped region can be further included. The isolation doped region is disposed below the first doped region, the second doped region, and the third doped region, and two ends of the isolation doped region can be further extended to the surface of the substrate to surround the memory cell region.

According to an embodiment of the invention, in the non-volatile memory structure, the first conductivity type is, for instance, one of N type and P type, and the second conductivity type is, for instance, the other of N type and P type.

According to an embodiment of the invention, in the non-volatile memory structure, during an operation of providing an electron hole to the channel region, a first voltage is applied to the first doped region, a second voltage is applied to the second doped region, and a third voltage is applied to the third doped region, wherein the first voltage is greater than the second voltage and the second voltage is greater than the third voltage.

According to an embodiment of the invention, in the non-volatile memory structure, the first voltage, the second voltage, and the third voltage can be respectively a positive voltage or a negative voltage.

The invention provides a method for preventing a non-volatile memory structure from generating program disturbance, including the following steps. A non-volatile memory structure is provided. The non-volatile memory structure includes a substrate, at least one memory cell, a first doped region, a second doped region, and a third doped region. The memory cell is disposed on the substrate and has a channel region located in the substrate. The first doped region, the second doped region, and the third doped region are sequentially disposed in the substrate in an arrangement direction toward the channel region, and the first doped region is farthest from the channel region. The first doped region and the third doped region are of a first conductive type, and the second doped region is of a second conductive type. A first voltage is applied to the first doped region, a second voltage is applied to the second doped region, and a third voltage is applied to the third doped region before a program operation is performed on the memory cell, wherein the first voltage is greater than the second voltage and the second voltage is greater than the third voltage.

According to an embodiment of the invention, in the method for preventing the non-volatile memory structure from generating program disturbance, the first voltage, the second voltage, and the third voltage can be respectively a positive voltage or a negative voltage.

Based on the above, in the non-volatile memory structure provided by the invention, the first doped region, the second doped region, and the third doped region are sequentially disposed in the substrate in an arrangement direction toward the channel region, and the first doped region and the third doped region are of a first conductive type, and the second doped region is of a second conductive type. Therefore, the first doped region, the second doped region, and the third doped region can form a bipolar junction transistor (BJT) structure in the substrate to provide an electron hole to the channel region of the memory cell before a program operation is performed, such that the electron hole and an electron of the channel region are recombined to reduce the voltage difference between the channel region and the control gate, so as to effectively prevent program disturbance to an unselected memory cell.

Moreover, in the method for preventing the non-volatile memory structure from generating program disturbance provided by the invention, before a program operation is performed on a memory cell, a first voltage is applied to a first doped region, a second voltage is applied to a second doped region, and a third voltage is applied to a third doped region, wherein the first voltage is greater than the second voltage, and the second voltage is greater than the third voltage to provide an electron hole to the channel region of the memory cell, such that the electron hole and an electron of the channel region are recombined to reduce the voltage difference between the channel region and the control gate, so as to effectively prevent program disturbance to an unselected memory cell.

In order to make the aforementioned features and advantages of the disclosure more comprehensible, embodiments accompanied with figures are described in detail below.

DESCRIPTION OF THE EMBODIMENTS

Figure 1:
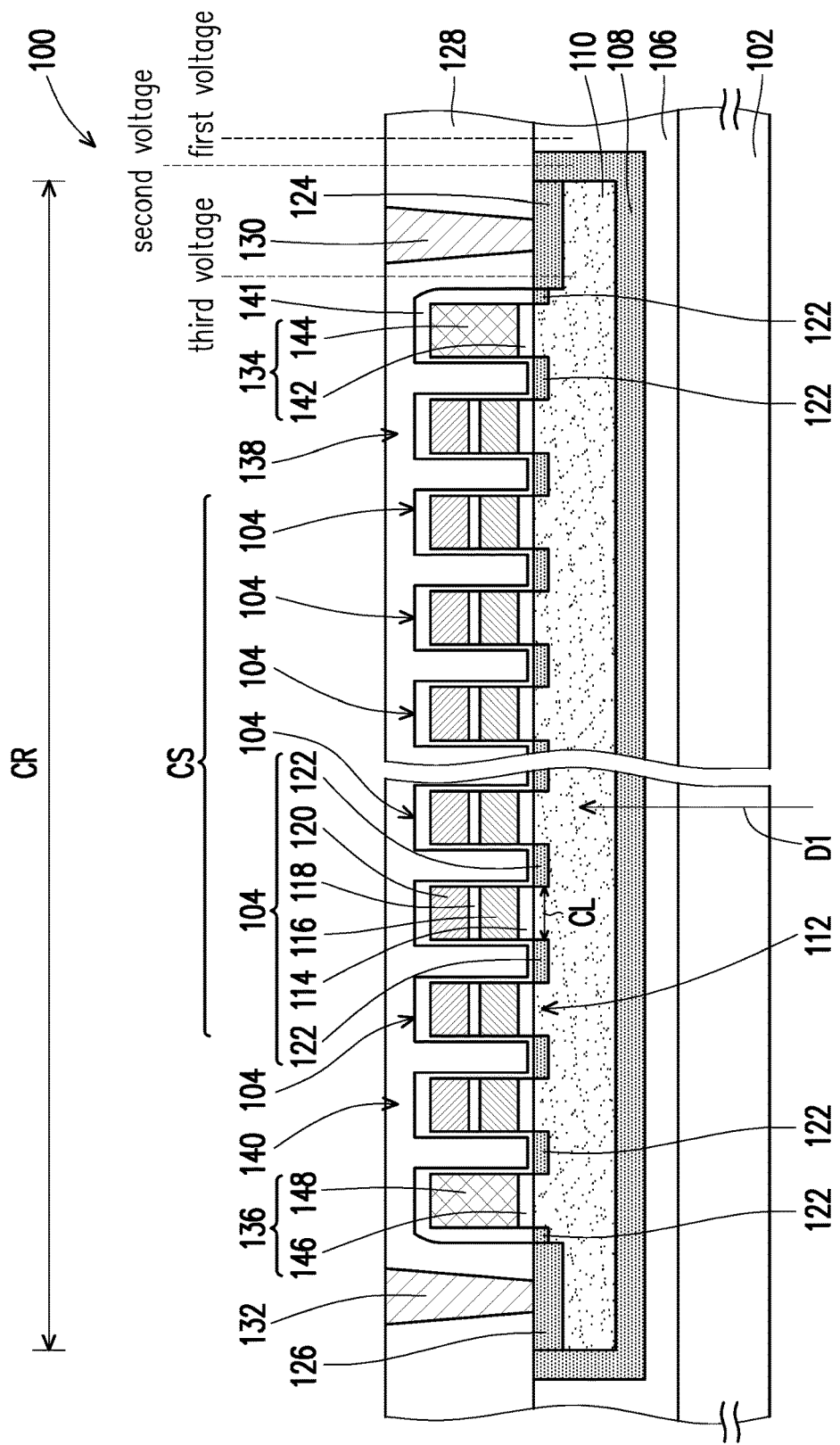
FIG. 1 is a cross-sectional diagram of a non-volatile memory structure of an embodiment of the invention.

FIG. 1 is a cross-sectional diagram of a non-volatile memory structure of an embodiment of the invention.

Referring to FIG. 1, a non-volatile memory structure 100 includes a substrate 102, at least one memory cell 104, a doped region 106, a doped region 108, and a doped region 110. In the present embodiment, the non-volatile memory structure 100 is exemplified by a NAND flash memory, but the invention is not limited thereto.

In the present embodiment, the quantity of the memory cell 104 is plural, for example, but the invention is not limited thereto. Moreover, the memory cells 104 can be connected in series to form a memory cell string CS. The memory cells 104 are disposed on the substrate 102 and have a channel region 112 located in the substrate 102. The substrate 102 is, for instance, a semiconductor substrate such as a silicon substrate. The memory cells 104 include a dielectric layer 114, a charge storage layer 116, a dielectric layer 118, and a conductive layer 120.

The dielectric layer 114 is disposed on the substrate 102. The dielectric layer 114 can be used as a tunneling dielectric layer. The material of the dielectric layer 114 is, for instance, silicon oxide. The forming method of the dielectric layer 114 is, for instance, a thermal oxidation method or a chemical vapor deposition method.

The charge storage layer 116 is disposed on the dielectric layer 114. The material of the charge storage layer 116 is, for instance, doped polysilicon or silicon nitride. When the material of the charge storage layer 116 is doped polysilicon, the charge storage layer 116 can be used as a floating gate. When the material of the charge storage layer 116 is silicon nitride, the charge storage layer 116 can be used as a charge trapping layer. However, the material of the charge storage layer 116 is not limited thereto, and any material that can store charge via a Fowler-Nordheim tunneling (FN tunneling) method can be used as the material of the charge storage layer 116. The forming method of the charge storage layer 116 is, for instance, a chemical vapor deposition method.

The dielectric layer 118 is disposed on the charge storage layer 116. The material of the dielectric layer 118 is, for instance, silicon oxide. The forming method of the dielectric layer 118 is, for instance, a chemical vapor deposition method.

The conductive layer 120 is disposed on the dielectric layer 118. The conductive layer 120 can be used as a control gate. The material of the conductive layer 120 is, for instance, a conductive material such as doped polysilicon. The forming method of the conductive layer 120 is, for instance, a chemical vapor deposition method.

Moreover, the memory cells 104 can further include two doped regions 122. The doped regions 122 are disposed in the substrate 102 at two sides of the conductive layer 120, and the channel region 112 is located between two adjacent doped regions 122. A channel length CL of the channel region 112 generally refers to the distance between two adjacent doped regions 122. Two adjacent memory cells 104 can share one doped region 122. The doped regions 122 can be N type doped regions or P type doped regions. In the present embodiment, the doped regions 122 are exemplified as N type doped regions.

The doped region 106, the doped region 108, and the doped region 110 are sequentially disposed in the substrate 102 in an arrangement direction D1 toward the channel region 112, and the doped region 106 is farthest from the channel region 112. The doped region 106 and the doped region 110 are of a first conductive type, and the doped region 108 is of a second conductive type. The first conductivity type is, for instance, one of N type and P type, and the second conductivity type is, for instance, the other of N type and P type. In the present embodiment, the first conductivity type is exemplified as P type, and the second conductivity type is exemplified as N type.

The arrangement direction D1 is, for instance, a direction toward the surface of the substrate 102, but the invention is not limited thereto. As a result, the doped region 106, the doped region 108, and the doped region 110 can form a vertical bipolar junction transistor (BJT) structure in the substrate 102 to provide an electron hole to the channel region 112 before a program operation is performed, such that the electron hole and an electron of the channel region 112 are recombined to reduce the voltage difference between the channel region 112 and the control gate (the conductive layer 120), so as to effectively prevent program disturbance to an unselected memory cell 104.

Specifically, during the operation of providing an electron hole to the channel region 112, a first voltage can be applied to the doped region 106, a second voltage can be applied to the doped region 108, and a third voltage can be applied to the doped region 110, wherein the first voltage is greater than the second voltage and the second voltage is greater than the third voltage. The first voltage, the second voltage, and the third voltage can be respectively a positive voltage or a negative voltage. Moreover, when the first voltage, the second voltage, and the third voltage are all positive voltages, an additional circuit does not need to be designed to apply a negative voltage, and therefore device area and process complexity can be effectively reduced.

Two ends of the doped region 108 can be further extended to the surface of the substrate 102 to surround a memory cell region CR to isolate the memory cell region CR and a peripheral circuit region (not shown).

Moreover, the non-volatile memory structure 100 can further optionally include at least one of a doped region 124, a doped region 126, a dielectric layer 128, a source line contact 130, a bit line contact 132, a select gate structure 134, a select gate structure 136, a dummy memory cell 138, a dummy memory cell 140, and a spacer layer 141.

The doped region 124 and the doped region 126 are respectively disposed in the substrate 102 at two sides of the memory cell string CS. The doped region 124 and the doped region 126 can be N type doped regions or P type doped regions. In the present embodiment, the doped region 124 and the doped region 126 are exemplified as N type doped regions.

The dielectric layer 128 covers the memory cell 104. The material of the dielectric layer 128 is, for instance, silicon oxide. The forming method of the dielectric layer 128 is, for instance, a chemical vapor deposition method.

The source line contact 130 is electrically connected to the doped region 124. The bit line contact 132 is electrically connected to the doped region 126. The source line contact 130 and the bit line contact 132 can be disposed in the dielectric layer 128. The material of the source line contact 130 and the bit line contact 132 is, for instance, a metal material such as tungsten, copper, or aluminum.

The select gate structure 134 is disposed between the doped region 124 and an end of the memory cell string CS. The select gate structure 134 can include a dielectric layer 142 and a select gate 144. The dielectric layer 142 is disposed on the substrate 102. The material of the dielectric layer 142 is, for instance, silicon oxide. The forming method of the dielectric layer 142 is, for instance, a thermal oxidation method or a chemical vapor deposition method. The select gate 144 is disposed on the dielectric layer 142. The material of the select gate 144 is, for instance, a conductive material such as doped polysilicon. The forming method of the select gate 144 is, for instance, a chemical vapor deposition method. Moreover, the doped regions 122 can also be disposed in the substrate 102 at two sides of the select gate structure 134. The select gate structure 134 and the dummy memory cell 138 can share the doped region 122 located therebetween.

The select gate structure 136 is disposed between the doped region 126 and the other end of the memory cell string CS. The select gate structure 136 can include a dielectric layer 146 and a select gate 148. The dielectric layer 146 is disposed on the substrate 102. The material of the dielectric layer 146 is, for instance, silicon oxide. The forming method of the dielectric layer 146 is, for instance, a thermal oxidation method or a chemical vapor deposition method. The select gate 148 is disposed on the dielectric layer 146. The material of the select gate 148 is, for instance, a conductive material such as doped polysilicon. The forming method of the select gate 148 is, for instance, a chemical vapor deposition method. Moreover, the doped regions 122 can also be disposed in the substrate 102 at two sides of the select gate structure 136. The select gate structure 136 and the dummy memory cell 140 can share the doped region 122 located therebetween.

The dummy memory cell 138 is disposed between the select gate structure 134 and an end of the memory cell string CS. The dummy memory cell 140 is disposed between the select gate structure 136 and the other end of the memory cell string CS. The dummy memory cell 138 and the dummy memory cell 140 can have the same structure as the memory cell 104 and are not repeated herein.

The spacer layer 141 covers the memory cell 104, the select gate structure 134, the select gate structure 136, the dummy memory cell 138, and the dummy memory cell 140. The material of the spacer layer 141 is, for instance, silicon oxide. The forming method of the spacer layer 141 is, for instance, a chemical vapor deposition method.

It can be known from the above embodiments that, in the non-volatile memory structure 100, the doped region 106, the doped region 108, and the doped region 110 can form a vertical bipolar junction transistor structure in the substrate 102 to provide an electron hole to the channel region 112 of the memory cell 104 before a program operation is performed, such that the electron hole and an electron of the channel region 112 are recombined to reduce the voltage difference between the channel region 112 and the control gate, so as to effectively prevent program disturbance to an unselected memory cell 104.

Moreover, the threshold voltage of the non-volatile memory structure 100 is not significantly offset after performing a certain number of program operations, and therefore the non-volatile memory structure 100 has better electrical performance.

Moreover, in current techniques, a Vpass voltage is applied to an unselected word line other than the word line selected for operation when preventing program disturbance, and the effect for preventing the generation of program disturbance is more significant for a larger Vpass. However, when the Vpass voltage is too large, significant Vpass voltage disturbance is also generated. However, via the non-volatile memory structure 100 of the present embodiment, excellent program disturbance prevention effect is still achieved even at a smaller Vpass voltage.

Figure 2:
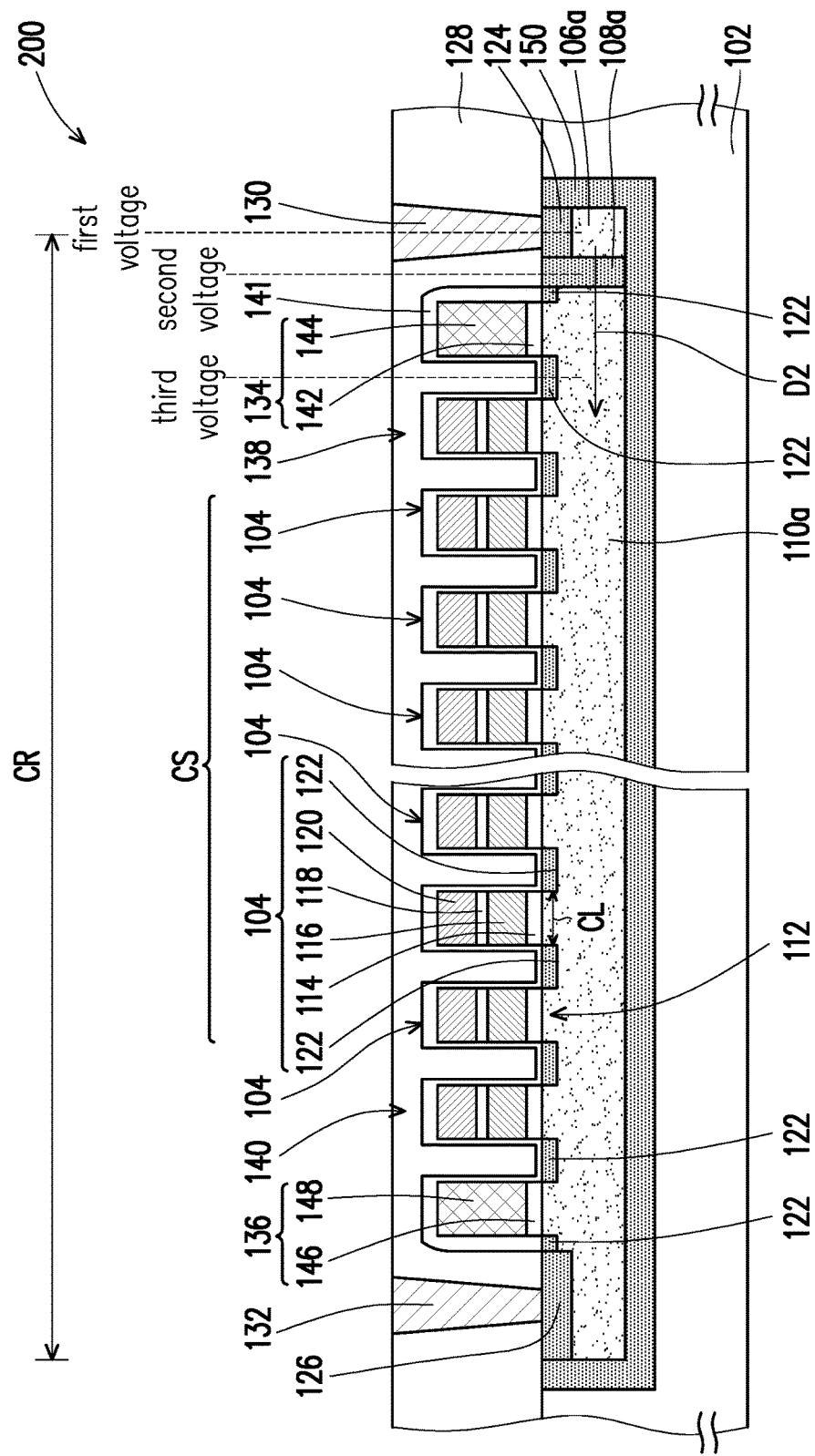
FIG. 2 is a cross-sectional diagram of a non-volatile memory structure of another embodiment of the invention.

FIG. 2 is a cross-sectional diagram of a non-volatile memory structure of another embodiment of the invention.

Referring to both FIG. 1 and FIG. 2, the differences of a non-volatile memory structure 200 of FIG. 2 and the non-volatile memory structure 100 of FIG. 1 are as follows. An arrangement direction D2 of a doped region 106a, a doped region 108a, and a doped region 110a in the non-volatile memory structure 200 is different from the arrangement direction D1 of the doped region 106, the doped region 108, and the doped region 110 in the non-volatile memory structure 100. In the embodiment of FIG. 2, the arrangement direction D2 is parallel to the channel length direction as an example.

Specifically, the doped region 106a, the doped region 108a, and the doped region 110a in the non-volatile memory structure 200 are sequentially disposed in the substrate 102 in the arrangement direction D2 toward the channel region 112, and the doped region 106a is farthest from the channel region 112, wherein the doped region 106a and the doped region 110a are of the first conductivity type, and the doped region 108a is of the second conductivity type. The doped region 106a is, for instance, located below the source line contact 130. The first conductivity type is, for instance, one of N type and P type, and the second conductivity type is, for instance, the other of N type and P type. In the present embodiment, the first conductivity type is exemplified as P type, and the second conductivity type is exemplified as N type.

As a result, the doped region 106a, the doped region 108a, and the doped region 110a can form a lateral bipolar junction transistor (BJT) structure in the substrate 102 to provide an electron hole to the channel region 112 of the memory cell 104 adjacent to the lateral BJT structure before a program operation is performed, such that the electron hole and an electron of the channel region 112 are recombined to reduce the voltage difference between the channel region 112 and the control gate (the conductive layer 120), so as to effectively prevent program disturbance to an unselected memory cell 104.

The non-volatile memory structure 200 can further include an isolation doped region 150. The isolation doped region 150 is disposed below the doped region 106a, the doped region 108a, and the doped region 110a, and two ends of the isolation doped region 150 can be further extended to the surface of the substrate 102 to surround the memory cell region CR. The isolation doped region 150 can isolate the memory cell region CR and a peripheral circuit region (not shown).

Moreover, the same components in the non-volatile memory structure 200 and the non-volatile memory structure 100 are represented by the same reference numerals and are not repeated herein.

It can be known from the above embodiments that, in the non-volatile memory structure 200, the doped region 106a, the doped region 108a, and the doped region 110a can form a lateral BJT structure in the substrate 102 to provide an electron hole to the channel region 112 of the memory cell 104 adjacent to the lateral BJT structure before a program operation is performed, such that the electron hole and an electron of the channel region 112 are recombined to reduce the voltage difference between the channel region 112 and the control gate, so as to effectively prevent program disturbance to an unselected memory cell 104. Moreover, the threshold voltage of the non-volatile memory structure 200 is not significantly offset, and therefore the non-volatile memory structure 200 has better electrical performance. Moreover, via the non-volatile memory structure 200 of the present embodiment, excellent program disturbance prevention effect is still achieved even at a smaller Vpass voltage.

Figure 3:
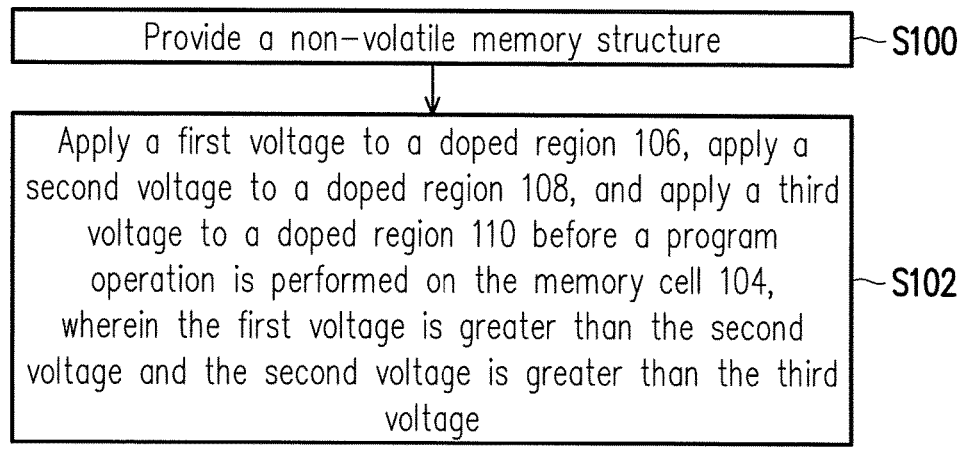
FIG. 3 is a flowchart of a method for preventing a non-volatile memory structure from generating program disturbance of an embodiment of the invention.

FIG. 3 is a flowchart of a method for preventing a non-volatile memory structure from generating program disturbance of an embodiment of the invention.

Referring to FIG. 3, step S100 is performed to provide a non-volatile memory structure. The non-volatile memory structure can adopt the non-volatile memory structure 100 of FIG. 1 or the non-volatile memory structure 200 of FIG. 2. In the present embodiment, the non-volatile memory structure 100 is exemplified.

Step S102 is performed to apply a first voltage to the doped region 106, apply a second voltage to the doped region 108, and apply a third voltage to the doped region 110 before a program operation is performed on the memory cell 104, wherein the first voltage is greater than the second voltage and the second voltage is greater than the third voltage. The first voltage, the second voltage, and the third voltage can be respectively a positive voltage or a negative voltage.

It can be known from the above embodiments that, by respectively applying the first voltage, the second voltage, and the third voltage to the doped region 106, the doped region 108, and the doped region 110, an electron hole can be provided to the channel region 112 of the memory cell 104 such that the electron hole and an electron of the channel region 112 are recombined to reduce the voltage difference between the channel region 112 and the control gate so as to effectively prevent program disturbance to an unselected memory cell 104.

Based on the above, in the non-volatile memory structure of the above embodiments, doped regions of different conductivity types can be alternately disposed in the substrate to form a BJT structure in the substrate. Therefore, the non-volatile memory structure of the above embodiments can effectively prevent program disturbance to an unselected memory cell and have better electrical performance.

Moreover, the method for preventing the non-volatile memory structure from generating program disturbance of the above embodiments can reduce the voltage difference between the channel region and the control gate to effectively prevent program disturbance to an unselected memory cell.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A non-volatile memory structure, comprising:
    a substrate;
    at least one memory cell disposed on the substrate and having a channel region located in the substrate; and
    a first doped region, a second doped region, and a third doped region sequentially disposed in the substrate in an arrangement direction toward the channel region, wherein the first doped region is farthest from the channel region, the first doped region and the third doped region are of a first conductive type, and the second doped region is of a second conductive type, wherein the first doped region and the substrate are different components, and the first doped region is disposed in a portion of the substrate, wherein the at least one memory cell comprises two fourth doped regions, and the channel region is located between two adjacent fourth doped regions, wherein a conductive type of the third doped region is different from a conductive type of the fourth doped regions, and wherein during an operation of providing an electron hole to the channel region, a first voltage is applied to the first doped region, a second voltage is applied to the second doped region, a third voltage is applied to the third doped region, the first voltage is greater than the second voltage and the second voltage is greater than the third voltage.

2. The non-volatile memory structure of claim 1, wherein the at least one memory cell further comprises:
a first dielectric layer disposed on the substrate;
a charge storage layer disposed on the first dielectric layer;
a second dielectric layer disposed on the charge storage layer; and
a conductive layer disposed on the second dielectric layer.

3. The non-volatile memory structure of claim 2, wherein a material of the charge storage layer comprises doped polysilicon or silicon nitride.

4. The non-volatile memory structure of claim 2, wherein the fourth doped regions are disposed in the substrate at two sides of the conductive layer.

5. The non-volatile memory structure of claim 4, wherein a quantity of the at least one memory cell is plural, and the memory cells are connected in series to form a memory cell string.

6. The non-volatile memory structure of claim 5, wherein two adjacent memory cells share one of the fourth doped regions.

7. The non-volatile memory structure of claim 5, further comprising a fifth doped region and a sixth doped region respectively disposed in the substrate at two sides of the memory cell string.

8. The non-volatile memory structure of claim 7, further comprising:
a source line contact electrically connected to the fifth doped region; and
a bit line contact electrically connected to the sixth doped region.

9. The non-volatile memory structure of claim 7, further comprising:
a first select gate structure disposed between the fifth doped region and an end of the memory cell string; and
a second select gate structure disposed between the sixth doped region and the other end of the memory cell string.

10. The non-volatile memory structure of claim 9, further comprising:
a first dummy memory cell disposed between the first select gate structure and the end of the memory cell string; and
a second dummy memory cell disposed between the second select gate structure and the other end of the memory cell string.

11. The non-volatile memory structure of claim 1, wherein the arrangement direction is a direction toward a surface of the substrate.

12. The non-volatile memory structure of claim 11, wherein two ends of the second doped region are further extended to the surface of the substrate to surround a memory cell region.

13. The non-volatile memory structure of claim 1, wherein the arrangement direction is parallel to a channel length direction.

14. The non-volatile memory structure of claim 13, wherein the first doped region is located below a source line contact.

15. The non-volatile memory structure of claim 13, further comprising an isolation doped region disposed below the first doped region, the second doped region, and the third doped region, and two ends of the isolation doped region are further extended to a surface of the substrate to surround a memory cell region.

16. The non-volatile memory structure of claim 1, wherein the first conductivity type is one of an N type and a P type, and the second conductivity type is the other of the N type and the P type.

17. The non-volatile memory structure of claim 1, wherein the first voltage, the second voltage, and the third voltage are respectively a positive voltage or a negative voltage.

18. A method for preventing a non-volatile memory structure from generating a program disturbance, comprising:
providing a non-volatile memory structure, comprising:
a substrate;
at least one memory cell disposed on the substrate and having a channel region located in the substrate; and
a first doped region, a second doped region, and a third doped region sequentially disposed in the substrate in an arrangement direction toward the channel region, wherein the first doped region is farthest from the channel region, the first doped region and the third doped region are of a first conductive type, and the second doped region is of a second conductive type, and
applying a first voltage to the first doped region, applying a second voltage to the second doped region, and applying a third voltage to the third doped region before a program operation is performed on the at least one memory cell, wherein the first voltage is greater than the second voltage and the second voltage is greater than the third voltage.

19. The method for preventing the non-volatile memory structure from generating the program disturbance of claim 18, wherein the first voltage, the second voltage, and the third voltage are respectively a positive voltage or a negative voltage.

* * * * *